(12) United States Patent
Hyodo et al.

(10) Patent No.: US 10,437,087 B2
(45) Date of Patent: Oct. 8, 2019

(54) DISPLAY DEVICE

(71) Applicant: Japan Display Inc., Tokyo (JP)

(72) Inventors: Yosuke Hyodo, Tokyo (JP); Shinichiro Oka, Tokyo (JP); Lu Jin, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/960,873

(22) Filed: Apr. 24, 2018

(65) Prior Publication Data

US 2018/0341143 A1 Nov. 29, 2018

(30) Foreign Application Priority Data

May 26, 2017 (JP) .................................. 2017-104518

(51) Int. Cl.
| | | |
|---|---|---|
| *G02F 1/1335* | (2006.01) | |
| *G02F 1/1333* | (2006.01) | |
| *G02F 1/1345* | (2006.01) | |
| *H01L 27/12* | (2006.01) | |
| *G02F 1/1368* | (2006.01) | |
| *H01L 29/786* | (2006.01) | |
| *G02F 1/1362* | (2006.01) | |
| *H01L 25/18* | (2006.01) | |
| *H01L 23/00* | (2006.01) | |

(52) U.S. Cl.
CPC ...... *G02F 1/133305* (2013.01); *G02F 1/1368* (2013.01); *G02F 1/13452* (2013.01); *G02F 1/133345* (2013.01); *G02F 1/133514* (2013.01); *G02F 1/136286* (2013.01); *H01L 27/124* (2013.01); *H01L 27/1218* (2013.01); *H01L 27/1225* (2013.01); *H01L 29/7869* (2013.01); *G02F 1/13458* (2013.01); *G02F 2001/13629* (2013.01); *G02F 2202/02* (2013.01); *G02F 2202/10* (2013.01); *H01L 24/16* (2013.01); *H01L 24/32* (2013.01); *H01L 24/73* (2013.01); *H01L 25/18* (2013.01); *H01L 2224/16145* (2013.01); *H01L 2224/32145* (2013.01); *H01L 2224/73204* (2013.01); *H01L 2924/1426* (2013.01)

(58) Field of Classification Search
None
See application file for complete search history.

(56) References Cited

U.S. PATENT DOCUMENTS 9,472,507 B2 * 10/2016 Kwak .................. H01L 23/562
2008/0017866 A1 * 1/2008 Sato .................. H01L 29/78654
257/72

(Continued)

FOREIGN PATENT DOCUMENTS

| JP | 2015-002177 A | 1/2015 |
|---|---|---|
| JP | 2015-007699 A | 1/2015 |

*Primary Examiner* — Minh Loan Tran
(74) *Attorney, Agent, or Firm* — Michael Best & Friedrich LLP

(57) ABSTRACT

A display device includes a first flexible substrate on which a display region and a peripheral region located along a periphery of the display region are arranged; a connection terminal provided in the peripheral region, the connection terminal being connected with an integrated circuit; and a first insulating film in contact with the first flexible substrate. The first insulating film is present in the display region, and the first insulating film is not present between the connection terminal and the first flexible substrate.

8 Claims, 11 Drawing Sheets

(56) References Cited

U.S. PATENT DOCUMENTS

2012/0138943 A1* 6/2012 Nakahara ................ C22C 21/00
257/59
2014/0319515 A1* 10/2014 Nagayama .......... H01L 27/1225
257/43

* cited by examiner

DISPLAY DEVICE

CROSS REFERENCE TO RELATED APPLICATIONS

This application is based on and claims the benefit of priority from the prior Japanese Patent Application No. 2017-104518, filed on May 26, 2017, the entire contents of which are incorporated herein by reference.

FIELD

The present invention relates to a flexible display device.

BACKGROUND

Recently, the demand for a flexible display device has been increased, and display devices have been progressively developed to have flexibility. Mainly developed so far as flexible display devices have been organic EL (electroluminescence) display devices, but recently, flexible liquid crystal display devices have also been progressively developed. For example, Japanese Laid-Open Patent Publication No. 2015-007699 discloses a liquid crystal display device including a thinned glass substrate or resin substrate as a support substrate.

SUMMARY

A display device in an embodiment according to the present invention includes a first flexible substrate on which a display region and a peripheral region located along a periphery of the display region are arranged; a connection terminal provided in the peripheral region, the connection terminal being connected with an integrated circuit; and a first insulating film in contact with the first flexible substrate. The first insulating film is present in the display region, and the first insulating film is not present between the connection terminal and the first flexible substrate.

A display device in an embodiment according to the present invention includes a first flexible substrate on which a display region and a peripheral region located along a periphery of the display region are arranged; a connection terminal provided in the peripheral region, the connection terminal being connected with an integrated circuit; a first insulating film in contact with the first flexible substrate in the display region and the peripheral region; and an organic insulating film provided between the connection terminal and the first insulating film.

DESCRIPTION OF EMBODIMENTS

Figure 1:
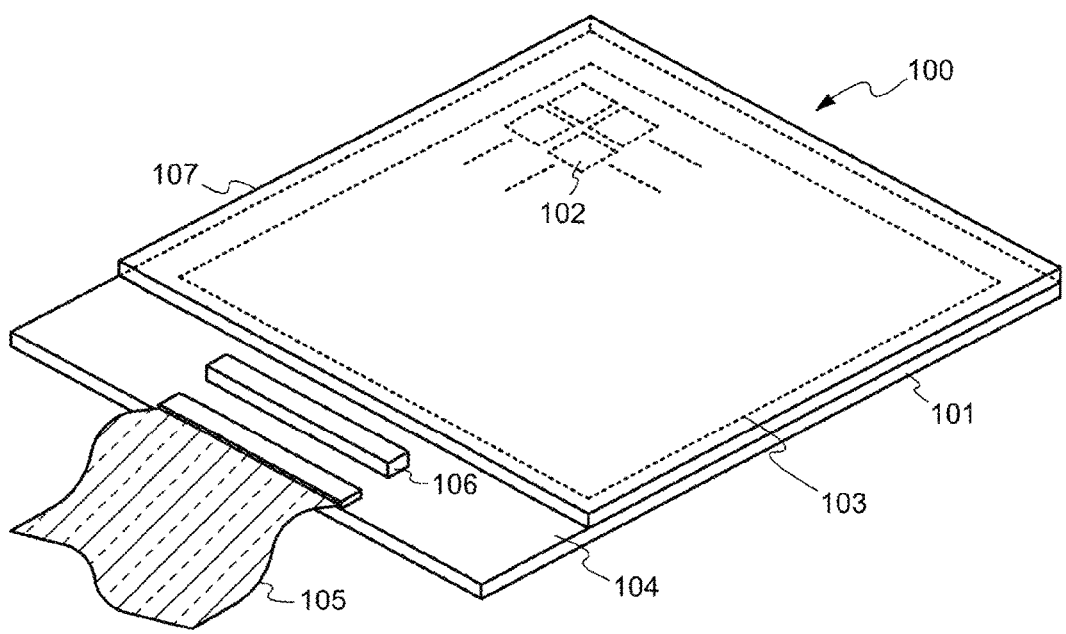
FIG. 1 is a perspective view schematically showing a structure of a liquid crystal display device in embodiment 1.

In the case where a resin substrate is used as a support substrate of a display device, the influence of the transmittance of the resin material needs to be considered. Especially, the support substrate of a liquid crystal display device needs to transmit light from a backlight unit, and therefore, the resin material used for the support substrate needs to be transparent with respect to visible light. Characteristics important for the resin substrate include a low phase difference from an optical point of view, in addition to transparency. A resin material selected to satisfy these requirements tends to have a low strength and a low elasticity for a film.

In order to improve the moisture resistance of the support substrate, an inorganic insulating film may be provided as a barrier layer on the resin substrate. In this case, in a pressure attachment step for mounting an integrate circuit (IC) on a connection terminal of the display device, the resin substrate below the connection terminal may be bent and thus the inorganic insulating film between the connection terminal and the resin substrate may be cracked. If the inorganic insulating film is cracked, the resin substrate may also be damaged, and as a result, the strength of the resin substrate may be decreased.

One object of the present invention is to improve the strength of the support substrate in an IC mounting portion of the display device.

Hereinafter, embodiments of the present invention will be described with reference to the drawings and the like. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification, the terms "on", "below" and the like each represent a relative positional relationship between the component of interest and another component. Specifically, as seen in a side view, in the case where a first component is described as being "on" a second component, the first component is located closer to a second substrate (counter substrate) than the second component. In the case where a first component is described as being "below" a second component, the first component is closer to a first substrate (array substrate) than the second component.

In the specification, a plurality of elements formed by a process such as etching, or the like performed on one certain film may be described as elements having different functions or roles from each other. These plurality of elements have the same structure and are formed of the same material, and are described as elements present in the same layer.

In the specification, the expressions that "a includes A, B or C", "a includes any of A, B and C" and "a includes one selected from the group consisting of A, B and C" do not exclude a case where a includes a plurality of combinations of A to C unless otherwise specified. The above expressions do not exclude a case where α include an element other than A, B and C.

A "display device" refers to a structural body that displays a video by use of an electro-optical layer. For example, the "display device" may refer to a display cell including an electro-optical layer or may refer to a structural body including the display cell and another optical member (e.g., polarization member, backlight unit, cover member, touch panel, etc.) attached to the display cell. The "electro-optical layer" may encompass a liquid crystal layer, an electroluminescence (EL) layer, an electrochromic (EC) layer and an electrophoretic layer, unless any technological contradiction occurs. In the following embodiments, a liquid crystal display device including a liquid crystal layer will be described as an example of display device. Nonetheless, the present invention is also applicable to any other type of display device including any other electro-optical layer as described above.

Embodiment 1

In this embodiment, a liquid crystal display device will be described as an example of display device according to the present invention. First, a structure of a liquid crystal display device 100 in embodiment 1 will be schematically described.

FIG. 1 is a perspective view schematically showing a structure of the liquid crystal display device 100 in embodiment 1. The liquid crystal display device 100 includes an array substrate 101, a counter substrate 107, and a liquid crystal layer 108 (FIG. 3) held between the array substrate 101 and the counter substrate 107. The array substrate 101 includes a display region 103 including a plurality of pixels 102 located in a matrix and a peripheral region 104 located along a periphery of the display region 103. In the peripheral region 104, an FPC (flexible printed circuit) substrate 105 supplying an external signal to the display region 103 and a driving IC (integrated circuit) 106 generating a driving signal to be supplied to the display region 103 are located.

A polarization film (not shown) may be provided adjacent to each of the array substrate 101 and the counter substrate 107. A backlight unit may be provided adjacent to either one of the array substrate 101 and the counter substrate 107.

The array substrate 101 includes a switching element such as a thin film transistor or the like in each of the plurality of pixels 102, and is referred to also as an active matrix substrate. The pixels 102 each include a pixel circuit using a thin film transistor as the switching element. The switching element is controlled to be on or off to control the alignment of liquid crystal molecules corresponding to each of the pixels 102.

The FPC substrate 105 and the driving IC 106 are connected to a connection terminal (not shown in FIG. 1), and supply a predetermined signal to the display region 103. In this embodiment, a video signal supplied from an external device (not shown) via the FPC substrate 105 is input to the driving IC 106. The video signal input to the driving IC 106 is subjected to a predetermined signal process and is output to the display region 103. The driving IC 106 generates a driving signal usable to supply a predetermined signal to a scanning line or a signal line (not shown) located in the display region 103.

FIG. 1 shows an example in which the driving IC 106 is provided in order to drive the scanning line and the signal line located in the display region 103. Alternatively, a gate driver circuit or a source driver circuit each including a thin film transistor may be provided along the periphery of the display region 103. In this case, the gate driver circuit or the source driver circuit is driven by a driving signal (start pulse, etc.) output from the driving IC 106.

The liquid crystal layer 108 (FIG. 3) is held between the array substrate 101 and the counter substrate 107. A structural body including the array substrate 101, the counter substrate 107 and the liquid crystal layer 108 between the array substrate 101 and the counter substrate 107 may be referred to as a liquid crystal cell. The counter substrate 107 is bonded to the array substrate 101 by use of a sealant formed of, for example, a resin material.

Figure 2:
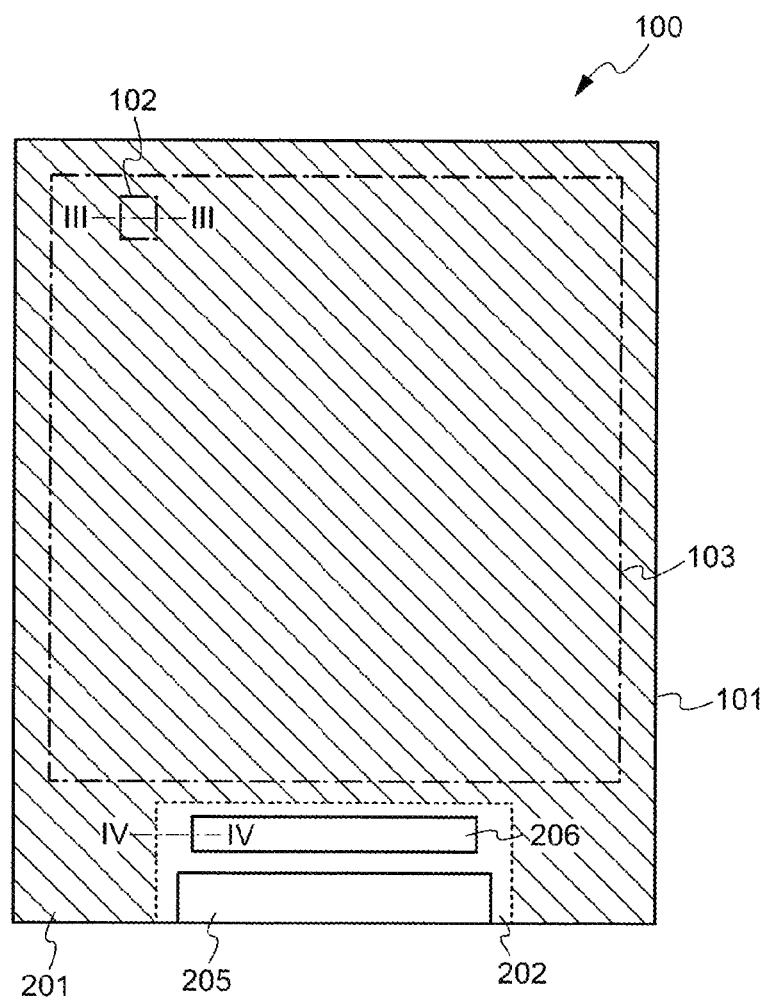
FIG. 2 is a plan view schematically showing the structure of the liquid crystal display device in embodiment 1.

FIG. 2 is a plan view schematically showing the structure of the liquid crystal display device 100 in embodiment 1. FIG. 2 omits the FPC substrate 105 and the driving IC 106 shown in FIG. 1. As shown in FIG. 2, the liquid crystal display device 100 includes an FPC mounting portion 205, on which the FPC substrate 105 is to be mounted. The liquid crystal display device 100 includes an IC mounting portion 206, on which the driving IC 106 is to be mounted. The FPC mounting portion 205 and the IC mounting portion 206 are each a connection terminal including a plurality of exposed terminal electrodes.

The hatched region in FIG. 2 is a region where an undercoat film 12 (FIG. 3) described below is provided. A region 202 with no hatching is a region where the undercoat film 12 described below is not provided. Herein, the "undercoat film" refers to an inorganic insulating film provided between a support substrate and the thin film transistors. In the liquid crystal display device 100 in this embodiment, the undercoat film 12 is not provided in the IC mounting portion 206 and the vicinity thereof.

Figure 3:
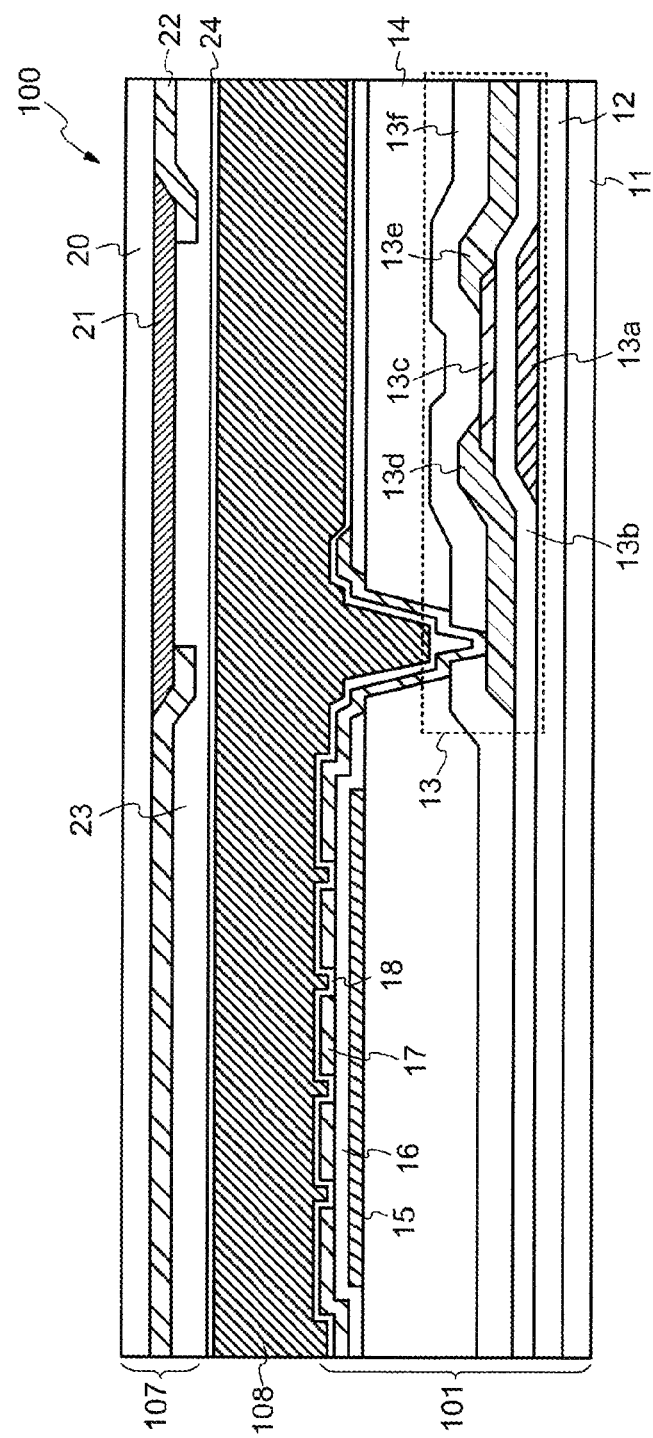
FIG. 3 is a cross-sectional view of a pixel in the liquid crystal display device in embodiment 1 taken along one-dot chain line III-Ill in FIG. 2.

FIG. 3 is a cross-sectional view of one pixel 102 taken along one-dot chain line III-III in FIG. 2. As shown in FIG. 3, the array substrate 101 includes a resin substrate 11 as the support substrate, the undercoat film 12, a TFT (thin film transistor) 13, a flattening film 14, a common electrode 15, an inorganic insulating film 16, a pixel electrode 17, and an alignment film 18. The array substrate 101 may include any other appropriate component, needless to say.

The resin substrate 11 is a flexible substrate formed of a transparent resin material. Thus, the resin substrate 11 may be referred to as a "first flexible substrate". In this specification, the term "resin substrate" refers to a flat plate-like member formed of a resin material. For example, the "resin substrate" encompasses a molded sheet-like member formed of a resin material (resin sheet) and a film-like member formed of a resin material (resin film). In this embodiment, the resin substrate 11 is a flexible transparent polyimide substrate.

Herein, the term "transparent" refers being transmissive with respect to visible light. It is desirable that a "transparent substrate" has a haze (degree of being cloudy) of 10% or less (preferably, 5% or less, more preferably 3% or less, most preferably 1% or less). The haze of, for example, a resin substrate may be measured by a haze meter (e.g., NDH-2000 produced by Nippon Denshoku Industries, Co., Ltd.) conformed to JIS K7361. Specifically, the total light transmittance Tt (%) and the scattered light transmittance Td (%) are found, and the haze (Td/Tt×100(%)) is obtained from these values. As the haze meter, a haze meter produced by Suga Test Instruments Co., Ltd. is also usable.

The undercoat film 12 is an inorganic insulating film formed of a silicon oxide film, a silicon nitride film or the like. The undercoat film 12 acts as a barrier film preventing entrance of moisture or gas from the resin substrate 11. Therefore, an inorganic insulating film having a high barrier property is often used as the undercoat film 12. In order to further improve the barrier property, it is desirable that the undercoat film 12 has a thickness of 100 nm or greater (preferably 300 nm or greater, more preferably 450 nm or greater). In this embodiment, the undercoat film 12 has a thickness of 600 nm. In this specification, the undercoat film 12 may be referred to as a "first insulating film".

The TFT 13 acts as a switching element controlling the pixel 102 to be on or off. In this embodiment, the TFT 13 is a so-called bottom gate-type TFT. Specifically, the TFT 13 in this embodiment includes a gate electrode 13a, a gate insulating film 13b, an active layer 13c, a drain electrode 13d, a source electrode 13e, and a protective film 13f. In this embodiment, the drain electrode 13d and the source electrode 13e are formed of a metal material. The functions of the drain electrode 13d and the source electrode 13e may be exchanged with each other in accordance with the direction in which carriers move.

The gate electrode 13a is formed of a metal material such as molybdenum, titanium, tantalum or the like. The gate insulating film 13b is formed of an inorganic material containing silicon oxide as a main component. In this embodiment, the gate insulating film 13b has a thickness of 120 nm, but is not limited to having such a thickness.

In this embodiment, the active layer 13c of the TFT 13 is formed of an oxide semiconductor. The oxide semiconductor usable for the active layer 13c may be, for example, a transparent amorphous oxide semiconductor (TAO). Specifically, an oxide containing at least one of indium, gallium and zinc, for example, indium gallium zinc oxide (IGZO), indium gallium oxide (IGO), indium zinc oxide (IZO), zinc tin oxide (ZnSnO), zinc oxide (ZnO) or the like is usable.

In this embodiment, the TFT 13 is formed in the state where the resin material as the material of the resin substrate 11 is provided on a glass substrate. Therefore, the heat resistance of the resin material needs to be considered for the formation of the TFT 13. From this point of view, an oxide semiconductor, which is formed into a film at a very low temperature of about 25° C. to about 100° C., may be formed into the active layer 13c even after the resin substrate 11 is formed of the resin material. The material for the active layer 13c may be any semiconductor material that may be formed into a film within a heat resistance temperature range of the resin material. The material for the active layer 13c is not limited to the transparent amorphous oxide semiconductor described above, and may be, for example, amorphous silicon.

The protective film 13f is an inorganic insulating film formed of silicon oxide, and has a role of protecting the TFT 13 against the flattening film 14, which is formed of a resin material. Namely, the protective film 13f has a function of preventing the flattening film 14 from directly contacting the active layer 13c.

The flattening film 14 is an organic insulating film formed of a resin material. The flattening film 14 has a function of flattening ruggedness caused by the formation of the TFT 13. In this embodiment, the flattening film 14 is formed of an acrylic resin. Alternatively, the flattening film 14 may be formed of another resin material such as polyimide, polyamide or the like.

The common electrode 15 is an electrode formed of a transparent conductive film. Specifically, the common electrode 15 is an electrode provided to form a lateral electric field between the common electrode 15 and the pixel electrode 17 facing the common electrode 15. The transparent conductive film as the common electrode 15 may be formed of an inorganic compound such as ITO (indium tin oxide), ZnO (zinc oxide) or the like.

The inorganic insulating film 16 is formed of silicon nitride, and is provided to cover the common electrode 15 and the flattening film 14. In this embodiment, the inorganic insulating film 16 electrically insulates the common electrode 15 and the pixel electrode 17 from each other, and also acts as a dielectric body for a storage capacitance formed of the common electrode 15 and the pixel electrode 17.

The pixel electrode 17 is an electrode formed of a transparent conductive film. The transparent conductive film as the pixel electrode 17 may be formed of an inorganic compound such as ITO (indium tin oxide), ZnO (zinc oxide) or the like. The pixel electrode 17 is electrically connected with the drain electrode 13d of the TFT 13 via a contact hole provided in the flattening film 14. With this structure, the potential of the pixel electrode 17 is controllable via the TFT 13, so that a desired voltage is applied between the common electrode 15 and the pixel electrode 17.

In this manner, an electric field is formed between the common electrode 15 and the pixel electrode 17, and the alignment of the liquid crystal molecules in the liquid crystal layer 108 is controlled by the electric field. The alignment film 18 may be a known alignment film but may be omitted.

As described above, in this embodiment, a lateral electric field (lateral field) is formed between the pixel electrode 17 and the common electrode 15. A system of display device using such a lateral field is referred to as an "IPS (In-Plain Switching) system". A system, of the IPS system, of using a lateral field formed between the common electrode 15 and the pixel electrode 17 provided in a stacking manner as in this embodiment is referred to as an "FFS (Fringe Field Switching) system. In this system, the lateral field is referred to also as a "fringe field".

Any other liquid crystal display system may be used. For example, a system of using a lateral field formed between a pixel electrode and a common electrode provided in the same layer may be used. Alternatively, a VA (Vertical Alignment) system of controlling the alignment of the liquid crystal molecules by a vertical electric field formed between a pixel electrode in an array substrate and a common electrode provided in a counter substrate may be used.

The liquid crystal display device 100 in this embodiment includes the array substrate 101 having the above-described structure and the counter substrate 107 located to face the array substrate 101. In this embodiment, the counter substrate 107 includes a flexible resin substrate 20, a light blocking film 21, a color filter 22, an overcoat film 23, and an alignment film 24. The alignment film 24 may be a known alignment film but may be omitted. In this specification, the resin substrate 20 may be referred to as a "second flexible substrate".

The resin substrate 20 may be formed of the same transparent resin material as that of the resin substrate 11.

Needless to say, the resin substrate 11 and the resin substrate 20 may be formed of different materials from each other.

The light blocking film 21 may be formed of, for example, a resin material containing a black pigment or carbon black. The light blocking film 21 is also referred to as a "black matrix". The light blocking film 21 is provided in order to block light, and therefore may be formed of a light-blocking metal material. However, in order to suppress light reflection, it is preferred to use a resin material containing a black pigment or carbon black.

Figure 4:
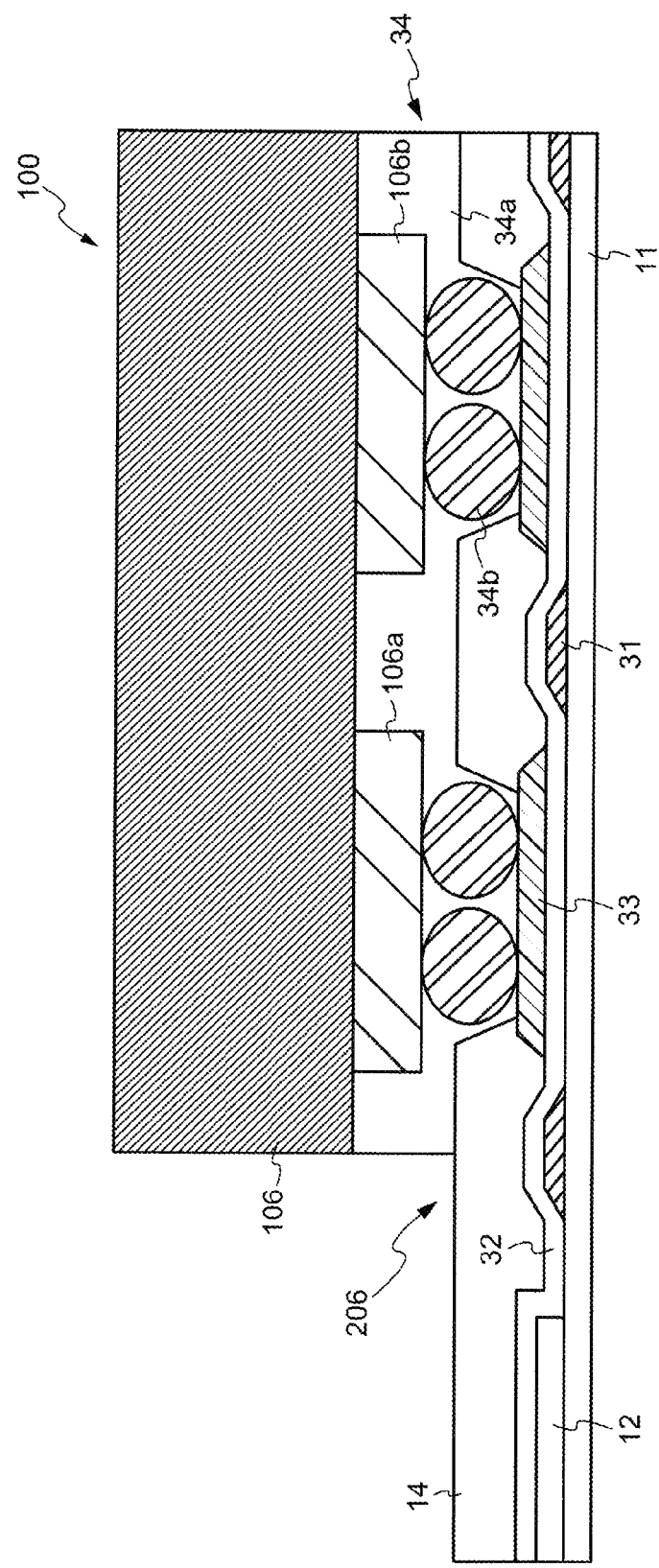
FIG. 4 is a cross-sectional view of an IC mounting portion and the vicinity thereof in the liquid crystal display device in embodiment 1 taken along one-dot chain line IV-IV in FIG. 2.

The color filter 22 is located in a light-transmissive region (region where light from the backlight unit is transmitted) in each of the pixels 102. The color filter 22 may be formed of, for example, a resin material containing a pigment. In accordance with the type of the pigment, the color filter 22 transmits light having a spectrum corresponding to each of colors of R (red), G (green), B (blue), W (white) or the like FIG. 4 is a cross-sectional view of the IC mounting portion 206 and the vicinity thereof taken along one-dot chain line IV-IV in FIG. 2. As shown in FIG. 4, the undercoat film 12, metal films 31, an inorganic insulating film 32, terminal electrodes 33, and the flattening film 14 are provided on the resin substrate 11. The plurality of terminal electrodes 33 are located side by side in a plan view, and an assembly of the plurality of terminal electrodes 33 forms the connection terminal. Namely, the connection terminal in the IC mounting portion 206 includes the plurality of terminal electrodes 33. The metal films 31 are located between terminal electrodes 33, among the plurality of terminal electrodes 33, adjacent to each other in a plan view.

The terminal electrodes 33 in the IC mounting portion 206 are respectively connected with bumps 106a and 106b of the driving IC 106 via an anisotropic conductive film 34. The anisotropic conductive film 34 includes a resin layer 34a as a binder and conductive particles 34b. As shown in FIG. 4, the terminal electrodes 33 and the bumps 106a and 106b of the driving IC 106 are electrically connected with each other via the conductive particles 34b held in the resin layer 34a.

The metal films 31 are obtained as a result of a film provided in the same layer as the gate electrode 13a shown in FIG. 3 being processed. Namely, the metal films 31 and the gate electrode 13a may be considered as forming the same metal wiring layer (hereinafter, referred to as a "first metal wiring layer"). Similarly, the terminal electrodes 33 are obtained as a result of a film provided in the same layer as the drain electrode 13d and the source electrode 13e shown in FIG. 3 being processed. Namely, the terminal electrodes 33, the drain electrode 13d and the source electrode 13e may be considered as forming the same metal wiring layer (hereinafter, referred to as a "second metal wiring layer").

In this specification, the terminal electrodes 33 may be referred to as a "first portion" of the second metal wiring layer, and the drain electrode 13d and the source electrode 13e may be referred to as a "second portion" of the second metal wiring layer, in order to distinguish the terminal electrodes 33, and the drain electrode 13d and the source electrode 13e, from each other. Herein, the "first portion" refers to a portion acting as an element of the connection terminal, and the "second portion" refers to as portion acting as an element of the thin film transistor.

As shown in FIG. 4, in the IC mounting portion 206 and the vicinity thereof, the undercoat film 12 is not present on the resin substrate 11. Namely, in this embodiment, a region including the IC amounting portion and the vicinity thereof in the peripheral region 104 is deprived of the undercoat film 12. In this embodiment, the conductive particles 34b are located between the terminal electrodes 33 acting as an element of the connection terminal and the driving IC 106 (more strictly, the pumps 106a and 106b). This will be described more specifically. When the driving IC 106 is pressure-attached to the connection terminal, the terminal electrodes 33 are supplied with a large force via the bumps 106a and 106b and the conductive particles 34b. However, since the undercoat film 12 is not present between the terminal electrodes 33 and the resin substrate 11, the problem that the undercoat film 12 is cracked and thus the resin substrate 11 is damaged does not occur.

As described above, the undercoat film 12 acts as a barrier film preventing entrance of the moisture or gas from the resin substrate 11. Such a barrier film is needed in order to protect the TFT 13 located on the resin substrate 11 in the display region 103 against the moisture or the gas from the resin substrate 11. Considered oppositely, there may be no problem even if the undercoat film 12 is not present in the FPC mounting portion 205 or the IC mounting portion 206, where no TFT 13 is provided. Therefore, in this embodiment, the undercoat film 12 formed of an inorganic insulating film is not provided at least in the IC mounting 206. With such an arrangement, the problem that the inorganic insulating film is cracked in the IC mounting portion 206 is prevented.

In the structure shown in FIG. 4, the inorganic insulating film 32 (acting as the gate insulating film 13b in the display region 103) is present between the terminal electrodes 33 and the resin substrate 11. However, in this embodiment, the thickness of the gate insulating film 13b (namely, the thickness of the inorganic insulating film 32) is sufficiently smaller than the thickness of the undercoat film 12, and therefore, the problem of cracks or the like does not occur.

In this embodiment, the metal films 31 are located between the terminal electrodes 33 adjacent to each other in a plan view. The metal films 31 may be omitted. Nonetheless, it is preferred in this embodiment to provide the metal films 31 in order to guarantee the strength of the IC mounting portion 206 because the undercoat film 12 is not provided in the IC mounting portion 206. In this embodiment, a portion of the second metal wiring layer is used as the terminal electrodes 33. Alternatively, a portion of the first metal wiring layer may be used as the terminal electrodes 33.

Embodiment 2

Figure 5:
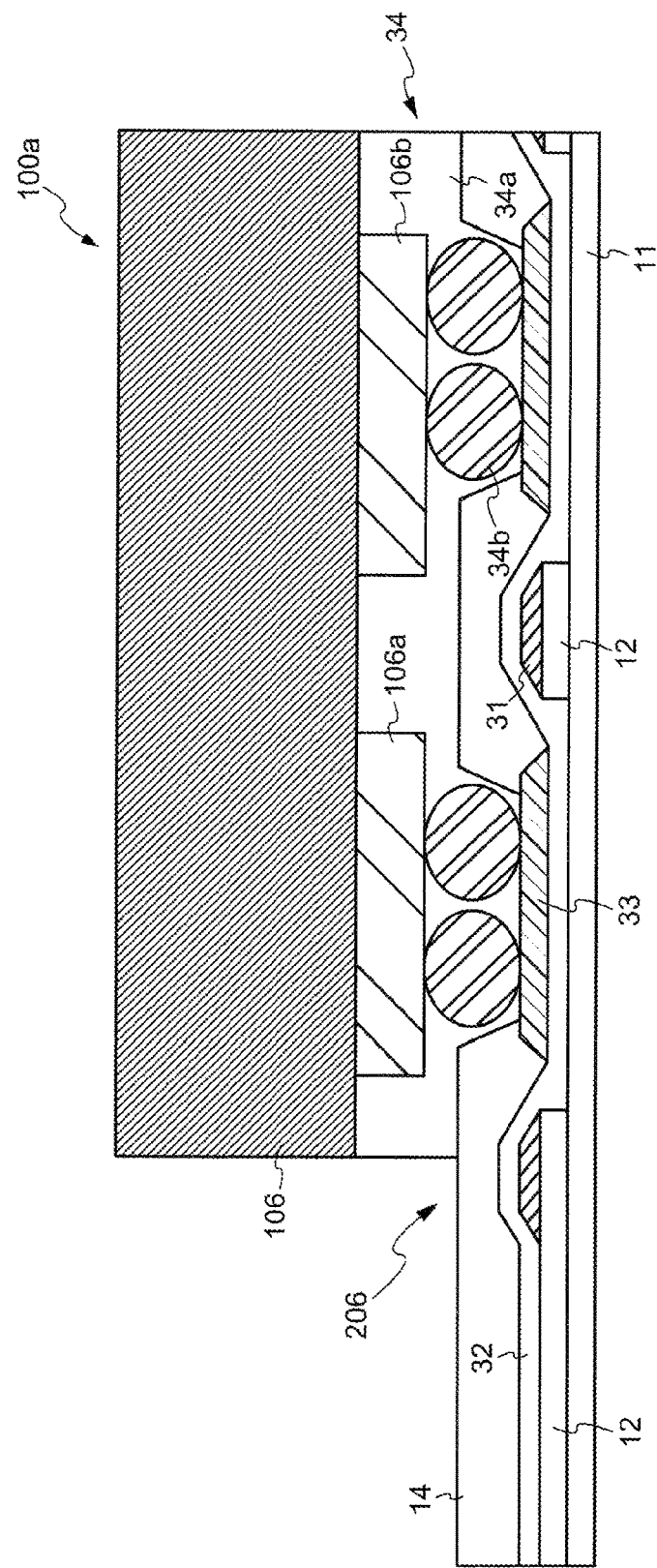
FIG. 5 is a cross-sectional view of an IC mounting portion and the vicinity thereof in a liquid crystal display device in embodiment 2.

With reference to FIG. 5, a liquid crystal display device 100a in embodiment 2 will be described. Unlike the liquid crystal display device 100 in embodiment 1, the liquid crystal display device 100a in embodiment 2 includes the undercoat film 12 in a part of the IC mounting portion 206. In this embodiment, the difference from embodiment 1 will be mainly described. The components and portions same as those in embodiment 1 will bear the same reference signs thereto and descriptions thereof may be omitted.

FIG. 5 is a cross-sectional view of the IC mounting portion 206 and the vicinity thereof in the liquid crystal display device 100a in embodiment 2. In the liquid crystal display device 100a shown in FIG. 5, the undercoat film 12 is present below the metal films 31. Namely, the liquid crystal display device 100e has the undercoat film 12 left between the resin substrate 11 and the metal films 31. In other words, in a plan view, the undercoat film 12 is not present below the terminal electrodes 33 and is present between the terminal electrodes 33 adjacent to each other.

In the structure in this embodiment, the strength of the IC mounting portion 206 is increased as compared with in embodiment 1.

Embodiment 3

Figure 6:
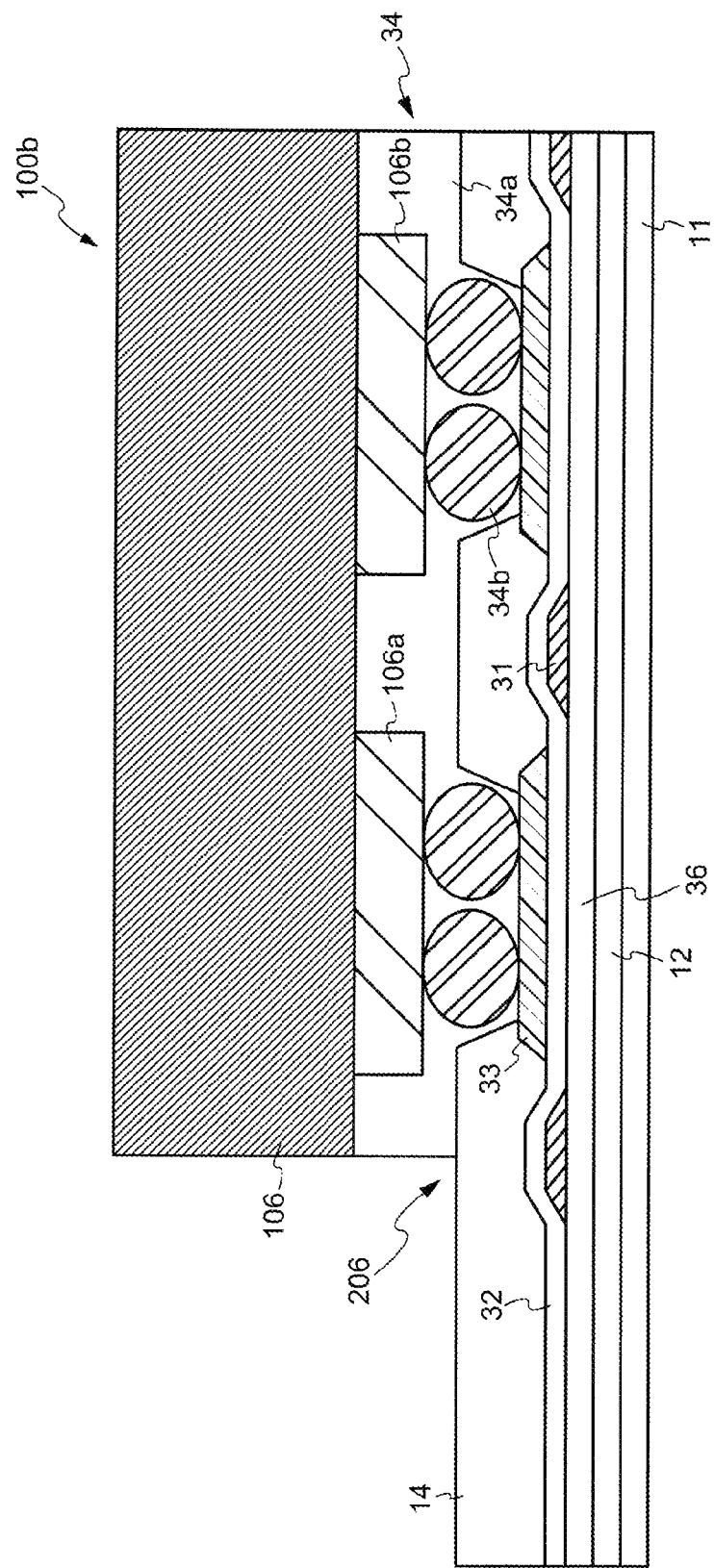
FIG. 6 is a cross-sectional view of an IC mounting portion and the vicinity thereof in a liquid crystal display device in embodiment 3.

With reference to FIG. 6, a liquid crystal display device 100b in embodiment 3 will be described. Unlike the liquid crystal display device 100 in embodiment 1, the liquid crystal display device 100b in embodiment 3 includes an organic insulating film 36 as a cushioning layer on the undercoat film 12. In this embodiment, the difference from embodiment 1 will be mainly described. The components and portions same as those in embodiment 1 will bear the same reference signs thereto and descriptions thereof may be omitted.

FIG. 6 is a cross-sectional view of the IC mounting portion 206 and the vicinity thereof in the liquid crystal display device 100b in embodiment 3. In the liquid crystal display device 100b in this embodiment, the organic insulating film 36 is provided on the undercoat film 12. Namely, in the IC mounting portion 206, the organic insulating film 36 is present between the terminal electrodes 33 and the undercoat film 12. The organic insulating film 36 may be formed of a resin material such as polyimide, acrylic resin or the like. It is desirable that the organic insulating film 36 has a thickness of 1 µm or greater and 5 µm or less (preferably, 1 µm or greater and 2 µm or less).

In the structure in this embodiment, the organic insulating film 36 provided between the terminal electrodes 33 and the undercoat film 12 is softer (lower in the elasticity) than the undercoat film 12. Therefore, the organic insulating film 36 acts as a cushioning layer. Namely, even if a large force is applied to the terminal electrodes 33 by the conductive particles 34b, the force is dispersed by the organic insulating film 36, and thus no large force is applied to the undercoat film 12. Therefore, the undercoat film 12 is prevented from, for example, being cracked.

FIG. 6 shows an example in which the organic insulating film 36 is provided between the undercoat film 12 and the inorganic insulating film 32. The location of the organic insulating film 36 is not limited to this. The effect of this embodiment is provided regardless of the position of the organic insulating film 36 as long as the insulating film 36 is provided between the terminal electrodes 33 and the undercoat film 12.

Figure 7:
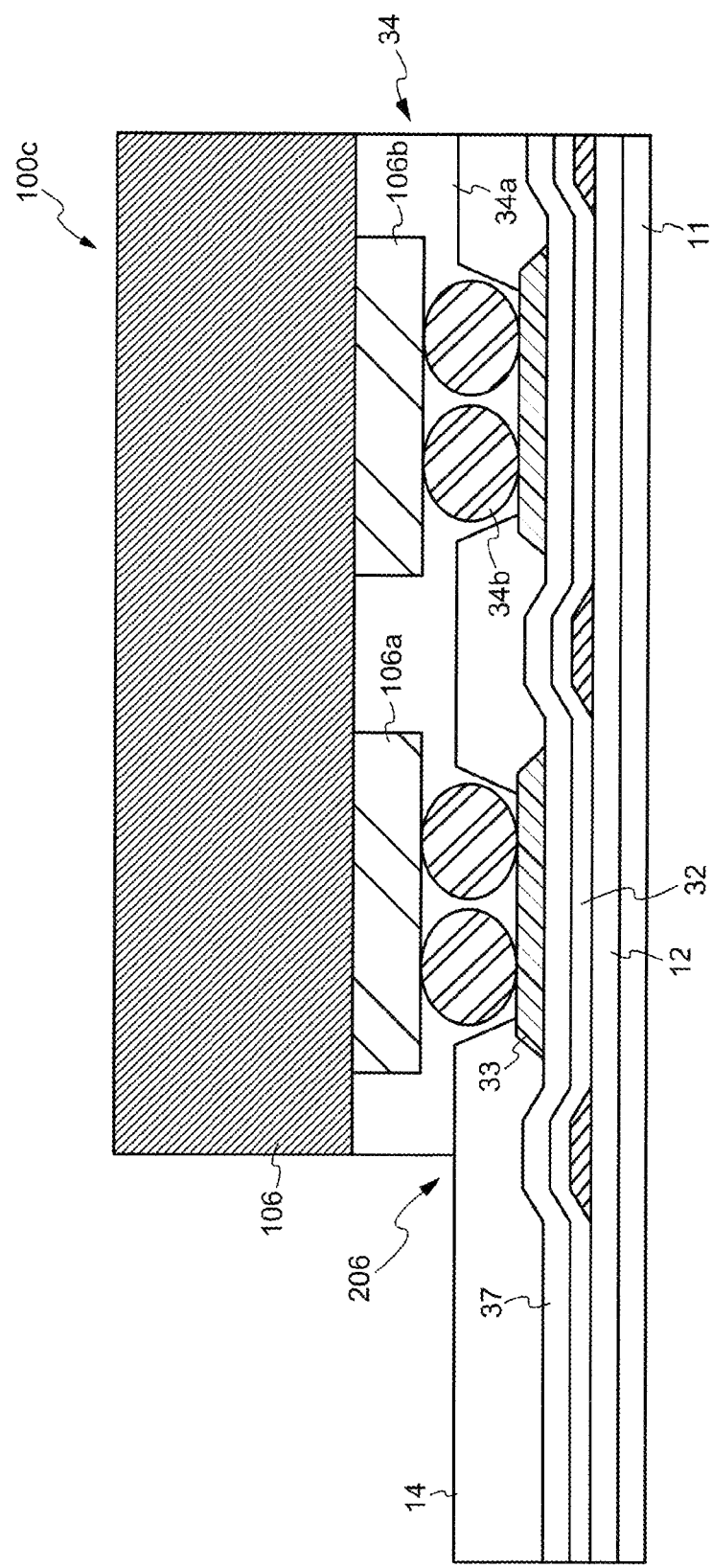
FIG. 7 is a cross-sectional view of an IC mounting portion and the vicinity thereof in a liquid crystal display device in embodiment 3.

FIG. 7 is a cross-sectional view of the IC mounting portion 206 and the vicinity thereof in a liquid crystal display device 100c in embodiment 3. As shown in FIG. 7, an organic insulating film 37 is provided between the inorganic insulating film 32 and the terminal electrodes 33. In this structure also, the organic insulating film 37 acts as a cushioning layer dispersing the force from the terminal electrodes 33.

In the structure shown in FIG. 6, the organic insulating film 36 is provided in contact with the undercoat film 12. In this case, the organic insulating film 36 may be formed of a resin material containing a coloring material (especially, pigment or dye). In the case where, for example, the organic insulating film 36 contains a red pigment, a blue pigment or a green pigment, the organic insulating film 36 may be used as a color filter in the display region 103. In the case where, for example, the organic insulating film 36 contains a black pigment, the organic insulating film 36 may be used as a light blocking film in the display region 103 or the peripheral region 104. The organic insulating film 36 may also be used as an overcoat film flattening the ruggedness caused by the formation of the color filter or the light blocking film in the display region 103.

Alternatively, an organic insulating film provided for the purpose of controlling a neutral plane of a foldable portion along which the liquid crystal display device 100b or the liquid crystal display device 100c is folded, or for the purpose of protecting the foldable portion, may be used as the organic insulating film 36 shown in FIG. 6 or as the organic insulating film 37 shown in FIG. 7.

The "neutral plane" will be described. When a structural body including a plurality of stacked films is folded, a plane at which a compression stress and a tensile stress acting on the films are reversed to each other is the "neutral plane". The compression stress acts on a recessed side of the folded portion, and the tensile stress acts on a protruding side of the folded portion. A plane at which the compression stress and the tensile stress are in balance is the "neutral plane". The position of the neutral plane is controllable by changing the stacking structure of the folded portion.

Embodiment 4

Figure 8:
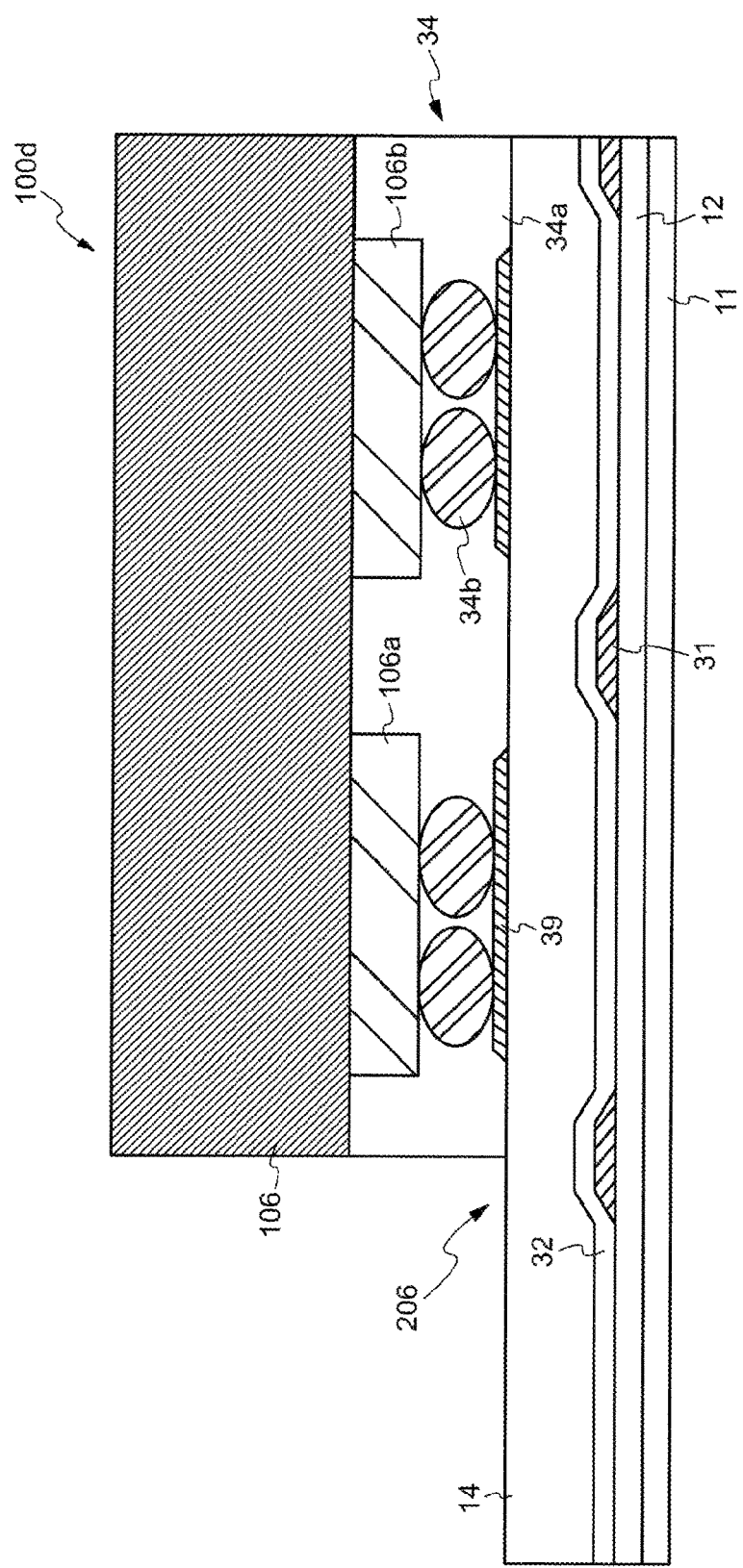
FIG. 8 is a cross-sectional view of an IC mounting portion and the vicinity thereof in a liquid crystal display device in embodiment 4.

With reference to FIG. 8, a liquid crystal display device 100d in embodiment 4 will be described. Unlike the liquid crystal display device 100 in embodiment 1, the liquid crystal display device 100d in embodiment 4 includes terminal electrodes 39 on the flattening film 14. In this embodiment, the difference from embodiment 1 will be mainly described. The components and portions same as those in embodiment 1 will bear the same reference signs thereto and descriptions thereof may be omitted.

FIG. 8 is a cross-sectional view of the IC mounting portion 206 and the vicinity thereof in the liquid crystal display device 100d in embodiment 4. In the liquid crystal display device 100d in this embodiment, the flattening film 14 is present in the entirety of the IC mounting portion 206, and the terminal electrodes 39 are provided on the flattening film 14. The terminal electrodes 39 are formed at the same time as the common electrode 15 shown in FIG. 3. In this embodiment, the terminal electrodes 39 have the same structure as that of, and are formed of the same material as that of, the common electrode 15 in the display region 103.

In this embodiment, the flattening film 14 formed of a resin material is present below the terminal electrodes 39. Therefore, the flattening film 14 acts as a cushioning layer. As a result, even if a force is applied to the terminal electrodes 39 by the conductive particles 34b, the undercoat film 12 is prevented from being cracked.

Embodiment 5

Figure 9:
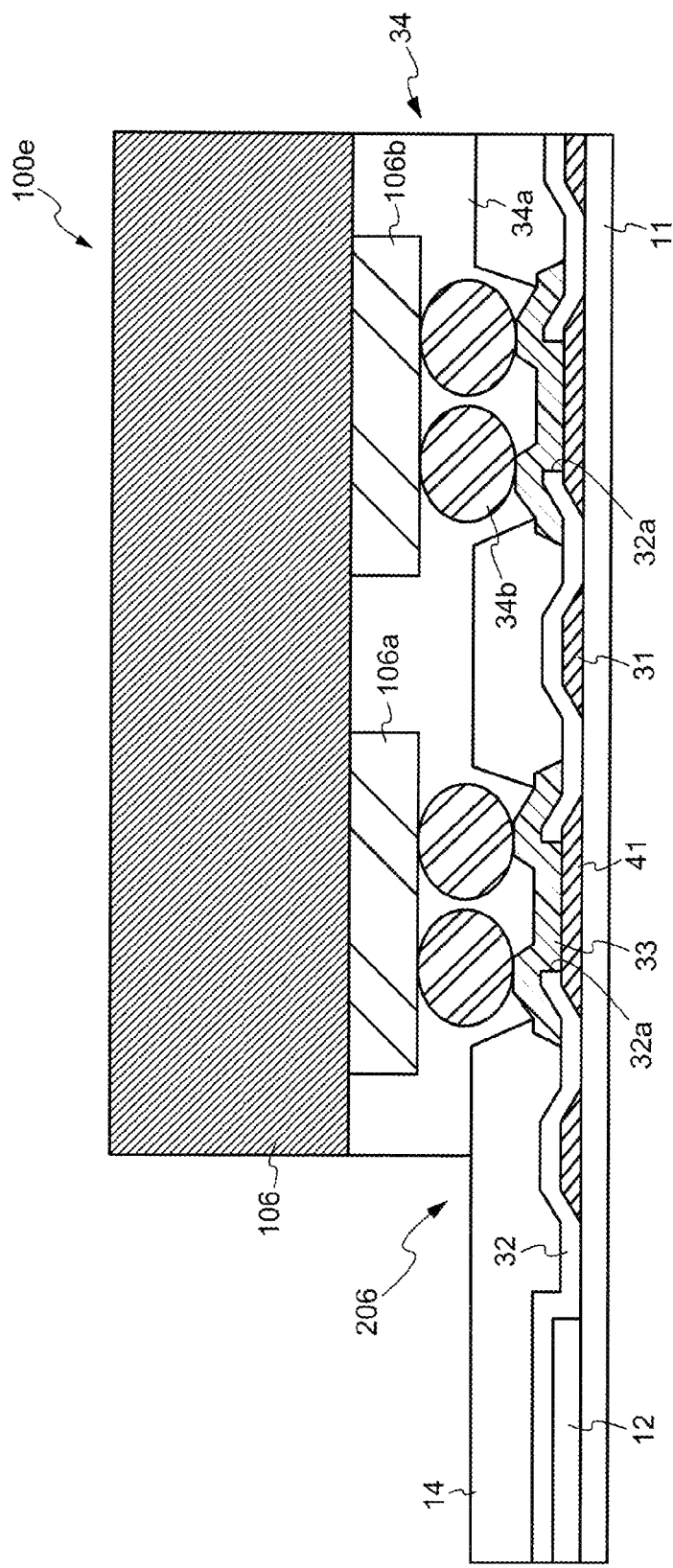
FIG. 9 is a cross-sectional view of an IC mounting portion and the vicinity thereof in a liquid crystal display device in embodiment 5.

With reference to FIG. 9, a liquid crystal display device 100e in embodiment 5 will be described. Unlike in the liquid crystal display device 100 in embodiment 1, in the liquid crystal display device 100e in embodiment 5, the connection terminal has a stack structure. In this embodiment, the difference from embodiment 1 will be mainly described. The components and portions same as those in embodiment 1 will bear the same reference signs thereto and descriptions thereof may be omitted.

FIG. 9 is a cross-sectional view of the IC mounting portion 206 and the vicinity thereof in the liquid crystal display device 100e in embodiment 5. As shown in FIG. 9, auxiliary electrodes 41 are located below the terminal electrodes 33. The auxiliary electrodes 41 and the terminal electrodes 33 are electrically connected with each other via openings 32a provided in the inorganic insulating film 32. Namely, the auxiliary electrodes 41 and the terminal electrodes 33 each act as a component of the connection terminal. The inorganic insulating film 32 is an insulating film formed in the same process as that of the gate insulating film 13b.

Like the metal films 31, the auxiliary electrodes 41 are obtained as a result of a film provided in the same layer as the gate electrode 13a shown in FIG. 3 being processed. Namely, the auxiliary electrodes 41 and the metal films 31 have the same structure, and are formed of the same material, as each other and form a first metal wiring layer. In this specification, the auxiliary electrodes 41 may be referred to as a "first portion" of the first metal wiring layer, and the gate electrode 13a may be referred to as a "second portion" of the first metal wiring layer, in order to distinguish the auxiliary electrodes 41 and the gate electrode 13a from each other.

In this embodiment, a plurality of stack structures each including the auxiliary electrode 41 and the terminal electrode 33 are located side by side to form the connection terminal. Therefore, the resistance of the entire connection terminal is decreased. Even if either the auxiliary electrode 41 or the terminal electrode 33 is broken, the connection terminal maintains the function thereof.

Embodiment 6

Figure 10:
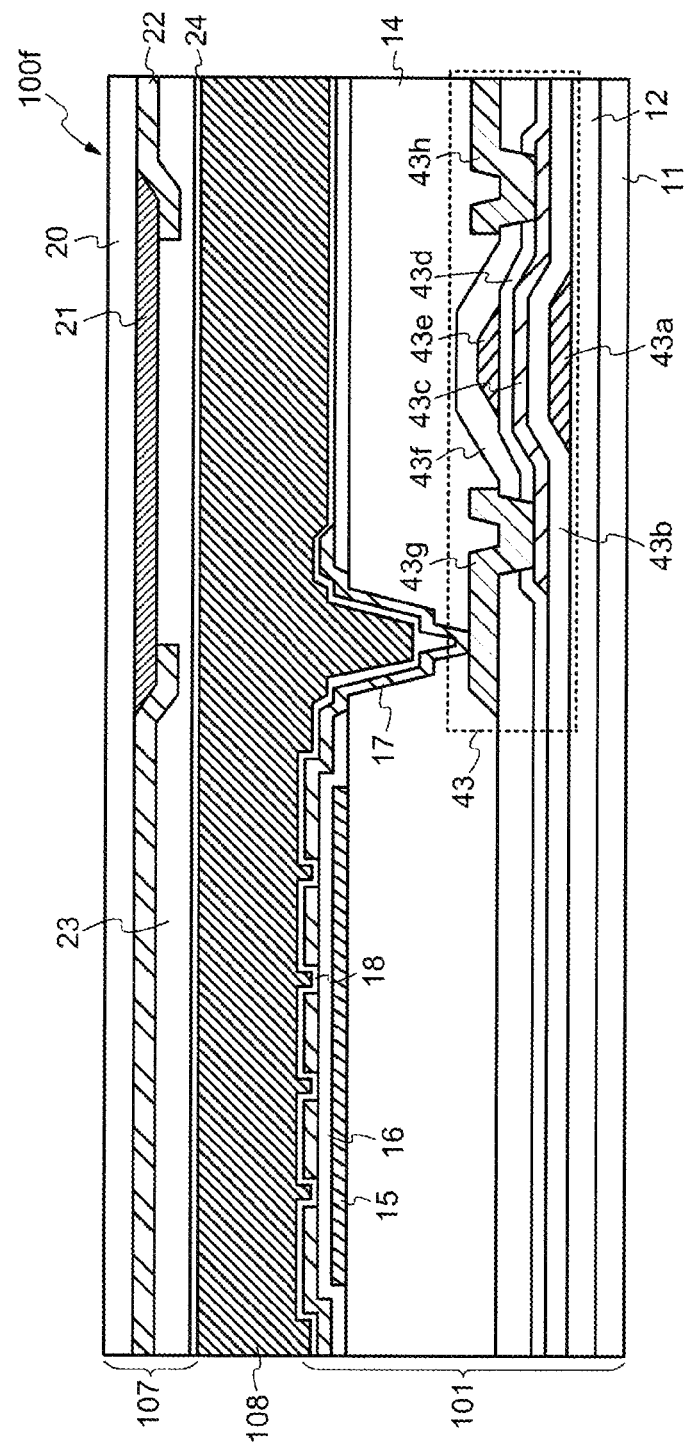
FIG. 10 is a cross-sectional view of a pixel in a liquid crystal display device in embodiment 6.
Figure 11:
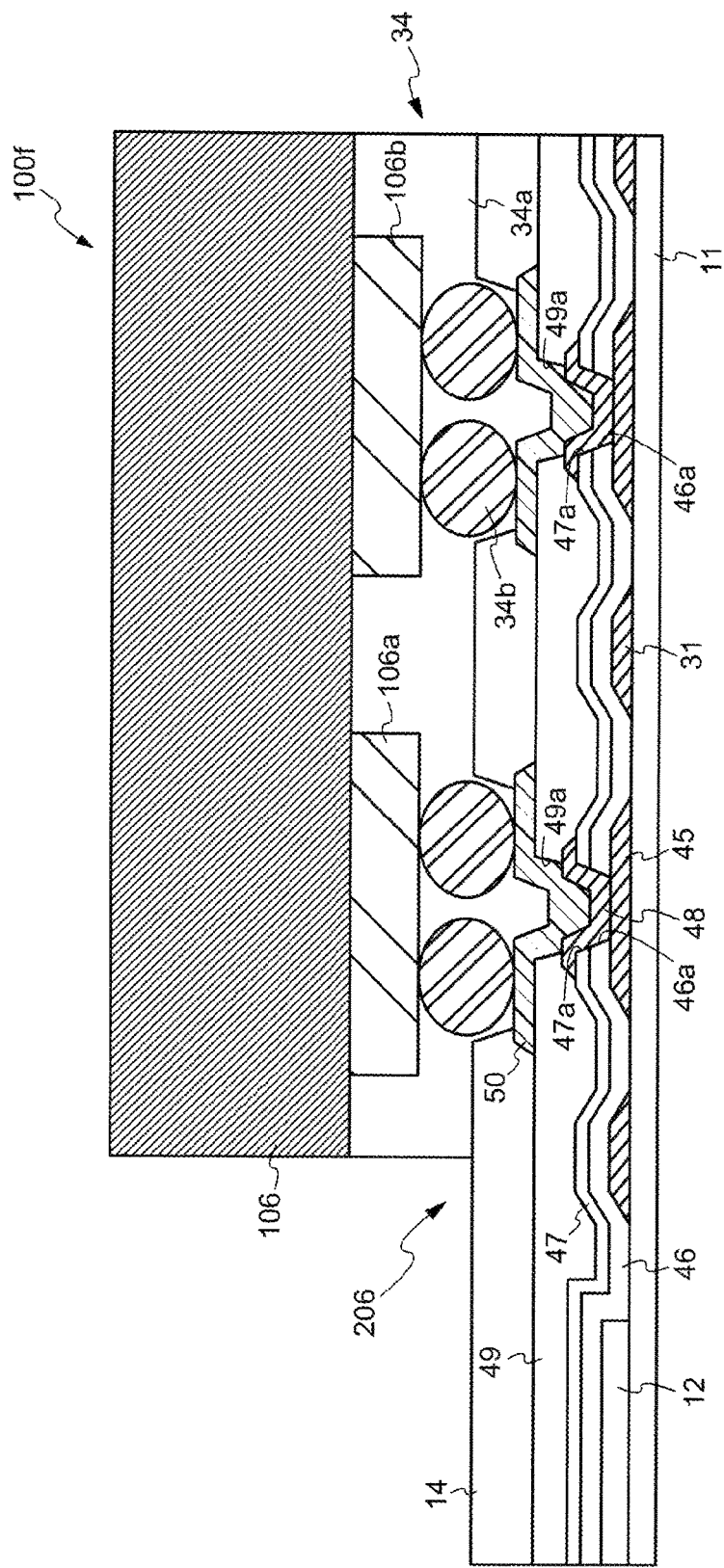
FIG. 11 is a cross-sectional view of an IC mounting portion and the vicinity thereof in the liquid crystal display device in embodiment 6.

With reference to FIG. 10 and FIG. 11, a liquid crystal display device 100f in embodiment 6 will be described. Unlike in the liquid crystal display device 100 in embodiment 1, in the liquid crystal display device 100f in embodiment 6, the connection terminal has a stack structure. In this embodiment, the difference from embodiment 1 will be mainly described. The components and portions same as those in embodiment 1 will bear the same reference signs thereto and descriptions thereof may be omitted.

FIG. 10 is a cross-sectional view of one pixel in the liquid crystal display device 100f in embodiment 6. FIG. 11 is a cross-sectional view of the IC mounting portion 206 and the vicinity thereof in the liquid crystal display device 100f in embodiment 6.

As shown in FIG. 10, in the liquid crystal display device 100f in this embodiment, a TFT 43 is a dual-gate TFT including two gate electrodes. Specifically, the TFT 43 in this embodiment includes a first gate electrode 43a, a first gate insulating film 43b, an active layer 43c, a second gate insulating film 43d, a second gate electrode 43e, an inorganic insulating film 43f, a drain electrode 43g, and a source electrode 43h. Although not shown, the first gate electrode 43a and the second gate electrode 43e may be supplied with different gate voltages or the same gate voltage. In the case where the same gate voltage is applied to the first gate electrode 43a and the second gate electrode 43e, the first gate electrode 43a and the second gate electrode 43e may be electrically connected with each other.

The first gate electrode 43a may be formed of the same metal material as that of the gate electrode 13a shown in FIG. 3 in embodiment 1. The second gate electrode 43e may be formed of the same metal material as that of, or a different metal material from that of, the first gate electrode 43a. In this embodiment, the first gate electrode 43a and the second gate electrode 43e are formed of the same metal material.

The active layer 43c may be formed of the same semiconductor as that of the active layer 13c shown in FIG. 3 in embodiment 1. In this embodiment, the active layer 43c of the TFT 43 is formed of an amorphous oxide semiconductor described in embodiment 1. The material of the active layer 43c is not limited to this.

In this embodiment, the first gate electrode 43a and the second gate electrode 43e both act on the active layer 43c, and thus the TFT 43 acts as a switching element. In this embodiment, as shown in FIG. 11, a metal wiring layer formed at the same time as the first gate electrode 43a, and a metal wiring layer formed at the same time as the second gate electrode 43e, are used as components of the connection terminal.

As shown in FIG. 11, first auxiliary electrodes 45 and second auxiliary electrodes 48 are located below terminal electrodes 50. The first auxiliary electrodes 45 and the second auxiliary electrodes 48 are electrically connected with each other via openings 46a formed in an organic insulating film 46 and openings 47a formed in an organic insulating film 47. The second auxiliary electrodes 48 and the terminal electrodes 50 are electrically connected with each other via openings 49a provided in an inorganic insulating film 49. Namely, the first auxiliary electrodes 45, the second auxiliary electrodes 48 and the terminal electrodes 50 all act as elements of the connection terminal. The inorganic insulating films 46, 47 and 49 are formed in the same process as the first gate insulating film 43b, the second gate insulating film 43d and the inorganic insulating film 43f, respectively.

Like the metal films 31, the first auxiliary electrodes 45 are obtained as a result of a film provided in the same layer as the first gate electrode 43a shown in FIG. 10 being processed. Namely, the first auxiliary electrodes 45 and the first gate electrode 43a have the same structure, and are formed of the same material, as each other and form a first metal wiring layer. In this specification, the first auxiliary electrodes 45 may be referred to as a "first portion" of the first metal wiring layer, and the first gate electrode 43a may be referred to as a "second portion" of the first metal wiring layer, in order to distinguish the first auxiliary electrodes 45 and the first gate electrode 43a from each other.

The second auxiliary electrodes 48 are obtained as a result of a film provided in the same layer as the second gate electrode 43e shown in FIG. 10 being processed. Namely, the second auxiliary electrodes 48 and the second gate electrode 43e have the same structure, and are formed of the same material, as each other and form a third metal wiring layer. In this specification, the second auxiliary electrodes 48 may be referred to as a "first portion" of the third metal wiring layer, and the second gate electrode 43e may be referred to as a "second portion" of the third metal wiring layer, in order to distinguish the second auxiliary electrodes 48 and the second gate electrode 43e from each other.

In this embodiment, a plurality of stack structures each including the first auxiliary electrode 45, the second auxiliary electrode 48, and the terminal electrode 50 are located side by side to form the connection terminal. Therefore, the resistance of the entire connection terminal is decreased. Even if any one of the first auxiliary electrode 45, the second auxiliary electrode 48 and the terminal electrode 50 is broken, the connection terminal maintains the function thereof.

The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention. The above-described embodiments may be optionally combined as long as no contradiction occurs.

Even functions and effects that are different from those provided by the above-described embodiments but are obvious from the description of this specification or are easily expectable by a person of ordinary skill in the art are naturally construed as being located by the present invention.

What is claimed is:

1. A display device, comprising:
a first flexible substrate on which a display region and a peripheral region located along a periphery of the display region are arranged;
a connection terminal provided in the peripheral region, the connection terminal being connected with an integrated circuit;
a first insulating film in contact with the first flexible substrate, and
a plurality of metal wiring layer, wherein
the first insulating film is present in the display region,
the first insulating film is not present between the connection terminal and the first flexible substrate in a cross-sectional view,
the plurality of metal wiring layers includes a first metal wiring layer closest to the first flexible substrate and a second metal wiring layer farther from the first flexible substrate than the first metal wiring layer, and
the connection terminal includes a first portion of the second metal wiring layer.

2. The display device according to claim 1, further comprising a transistor including a semiconductor, wherein the plurality of metal wiring layers further includes a third metal wiring layer,
in the display region, the semiconductor is present in a second portion of the first metal wiring layer and a second portion of the third metal wiring layer, and
the connection terminal includes a first portion of the first metal wiring layer and a first portion of the third metal wiring layer.

3. The display device according to claim 2, wherein the semiconductor is an oxide semiconductor, and
the second portion of the first metal wiring layer and the second portion of the third metal wiring layer are each supplied with a gate voltage.

4. The display device according to claim 3, wherein the connection terminal includes a plurality of terminal electrodes, and
in a plan view, the first insulating film is present between terminal electrodes, among the plurality of terminal electrodes, adjacent to each other.

5. The display device according to claim 2, wherein the connection terminal includes a plurality of terminal electrodes, and
in a plan view, the first insulating film is present between terminal electrodes, among the plurality of terminal electrodes, adjacent to each other.

6. The display device according to claim 1, wherein the connection terminal includes a plurality of terminal electrodes, and
in a plan view, the first insulating film is present between terminal electrodes, among the plurality of terminal electrodes, adjacent to each other.

7. The display device according to claim 1, wherein the first flexible substrate is a transparent polyimide substrate.

8. The display device according to claim 1, wherein the first insulating film has a thickness of 100 nm or greater.

* * * * *